US007233365B2

(12) United States Patent
Stutz

(10) Patent No.: US 7,233,365 B2
(45) Date of Patent: Jun. 19, 2007

(54) DIGITAL DC RESTORE METHODS AND APPARATUS

(75) Inventor: William M. Stutz, Indianapolis, IN (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 360 days.

(21) Appl. No.: 10/931,877

(22) Filed: Sep. 1, 2004

(65) Prior Publication Data

US 2006/0044474 A1    Mar. 2, 2006

(51) Int. Cl.
*H03M 1/12* (2006.01)
*H04N 5/14* (2006.01)
*H04N 5/16* (2006.01)
*H04N 5/18* (2006.01)
*H04N 5/202* (2006.01)

(52) U.S. Cl. .............. 348/572; 348/673; 348/677; 348/689; 348/691

(58) Field of Classification Search .......... 348/257, 348/572, 673, 677, 689, 691; 375/319; *H03M 1/12; H04N 5/14, 5/16, 5/18, 5/202*
See application file for complete search history.

(56) References Cited

U.S. PATENT DOCUMENTS

| | | | |
|---|---|---|---|
| 4,463,387 A | | 7/1984 | Hashimoto et al. |
| 5,798,802 A | * | 8/1998 | Elmis et al. .............. 348/689 |
| 5,841,488 A | * | 11/1998 | Rumreich ................. 348/694 |
| 6,304,615 B1 | * | 10/2001 | Webster .................... 375/319 |
| 6,529,248 B1 | * | 3/2003 | Tsyrganovich ........... 348/691 |
| 6,580,465 B1 | * | 6/2003 | Sato ......................... 348/689 |
| 6,956,621 B2 | * | 10/2005 | Movshovish et al. ...... 348/691 |
| 7,126,645 B2 | * | 10/2006 | Keen ......................... 348/695 |

OTHER PUBLICATIONS

"Encoding Parameters of Digital Television for Studios", Recommendation ITU-R BT.601-4 of the ITU Radiocommunication Assembly, 1982, 1986, 1990, 1992, 1994, pp. 1-13.
Intersil Corporation, AN9514 Application Note, Video Amplifier with Sync Stripper and DC Restore (HFA1103), Jun. 1995, pp. 1-2.
Shifrin, Lazar, "Digital sync-tip clamping: a new approach to video-signal conditioning", EDN Magazine, Oct. 8, 1998, pp. 111-119.
Maxim Integrated Products, Inc., "Video Basics", APP 734, Apr. 17, 2001, pp. 1-7.
Maxim Integrated Products, Inc., "Understanding Analog Video Signals", APP 1184, Sep. 4, 2002, pp. 1-6.

* cited by examiner

*Primary Examiner*—Brian P. Yenke
(74) *Attorney, Agent, or Firm*—Blakely Sokoloff Taylor & Zafman LLP

(57) ABSTRACT

Digital dc restore methods and apparatus to restore the DC component of an analog waveform to a quantized reference value level at a given temporal point on a waveform, prior to an ADC. This may used to establish the relationship between the full scale digital value out of the ADC and the waveform being digitized. For a video signal, the Digital Value of Black, is compared with the value on the back porch of the video signal. The difference is converted to the analog domain by a DAC clocked at the Temporal Point to provide a sample and hold function. An amplifier compares the difference, mapped to one half full scale digital, to an analog common mode voltage for the ADC, removing any error due to the difference between them. Other applications include correlated double sampling of contact image sensors to remove Dark Current Offset.

12 Claims, 2 Drawing Sheets

DIGITAL DC RESTORE METHODS AND APPARATUS

BACKGROUND OF THE INVENTION

1. Field of the Invention

The present invention relates to the field of analog signals, and more specifically, to the restoration of DC levels in analog signals prior to conversion to digital form.

2. Prior Art

DC restoration is the process by which the quiescent value of a waveform is established with respect to a reference value. The deviation from the reference value is an error. DC restoration is accomplished by a machine called a servo-mechanism, specifically a regulator, and can be analyzed as such. For video signals, all presently available commercial implementations only regulate a video level to an analog reference.

Important applications exist, including but not limited to video, where the input and output variables are in different domains. The input is an analog value and the output is a digital value, with the error specified in terms of the LSB at a given point on the waveform.

An analog video signal is comprised of a camera signal (image information) periodically interrupted by blanking intervals. Each horizontal blanking interval consists of a front porch signal level, followed by a horizontal sync signal, followed by a back porch level and then by the camera signal again. The front and back porch levels are the same, corresponding to the Black level for the camera signal, with the horizontal sync signal being in the opposite sense to the camera signal, sometimes referred to as Blacker than Black.

The front porch period is nominally only one fourth as long as the horizontal sync period, though the back porch is nominally three fourths as long as the horizontal sync period. For definiteness in distinguishing the front and back porches from the horizontal sync signal, the Black level is intentionally set somewhat "above" the level that will be interpreted as the horizontal sync level. An example is the ITU-R BT.601 Specification of Studio Encoding Parameters for TV, in which the digital level of Black is given as 16 and 64 for 8 or 10 bit quantizations, respectively. It is important to accurately maintain the Black level not only to avoid falsely interpreting the same as a horizontal sync signal, but also to provide an accurate reference for Black in the camera signal. The back porch, being longer in time and defined as Black, becomes a convenient reference for sensing and correcting the Black level.

An example of a design used for such applications is shown in FIG. 1. The input (Analog Video In) is gained up by the operational amplifier (op-amp) A1, whose output is compared during a sample interval with an analog reference Restore Voltage by op-amp A2. At the end of the sample interval, the output of the comparison is held in the sample and hold circuit S/H until the end of the next sample period. Resistor R7 and capacitor C3 provide a filtering or averaging function during the sample interval.

The above approach has several problems.

1. Although a closed loop servomechanism, it regulates the output to an analog voltage, not the quantized digital value of Black specified.
2. The loop is closed around the input op-amp A1, not the differentially biased input to the analog to digital converter (ADC), leaving out the error in the anti-aliasing filter and Vcom (common mode voltage). These can be added in existing designs, but add several op-amps to the circuit.
3. It has a finite hold time determined by the S/H leakage, causing "droop" during a horizontal line.

Solutions to these problems have appeared as various forms of "Infinite S/H" where the reference is replaced by a D/A decoding of the digital value of Black level, as shown in FIG. 2. The output of op-amp A1 is still open loop, passing through the Filter, a single ended to differential conversion (SE To Diff) and then to the A/D converter. This removes the errors due to the finite S/H, but doesn't form a closed loop to reduce the variations with time and temperature. The fact that the reference is determined in the same domain is often enough to get the error within a few LSBs. This is the result of weak correlation due to common supply and reference voltages.

While video has been used as an exemplary application, the present invention is applicable to other applications. By way of but one example, the invention is applicable to correlated double sampling, such as with contact image sensors, where the desired output is the difference between the current output of each pixel sensor when exposed to the image and the current output when that pixel is not illuminated, referred to as the "Dark Current Offset".

DETAILED DESCRIPTION OF THE PREFERRED EMBODIMENTS

Figure 1:
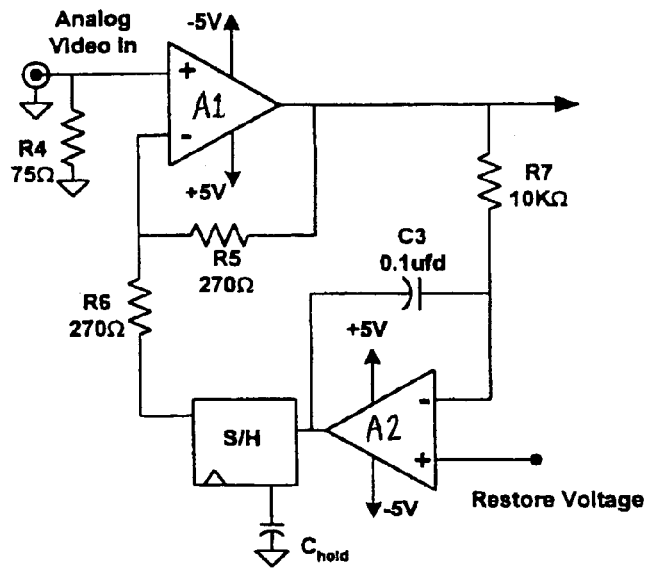
FIG. 1 is a diagram of a prior art circuit for restoring the DC level in a video signal.
Figure 2:
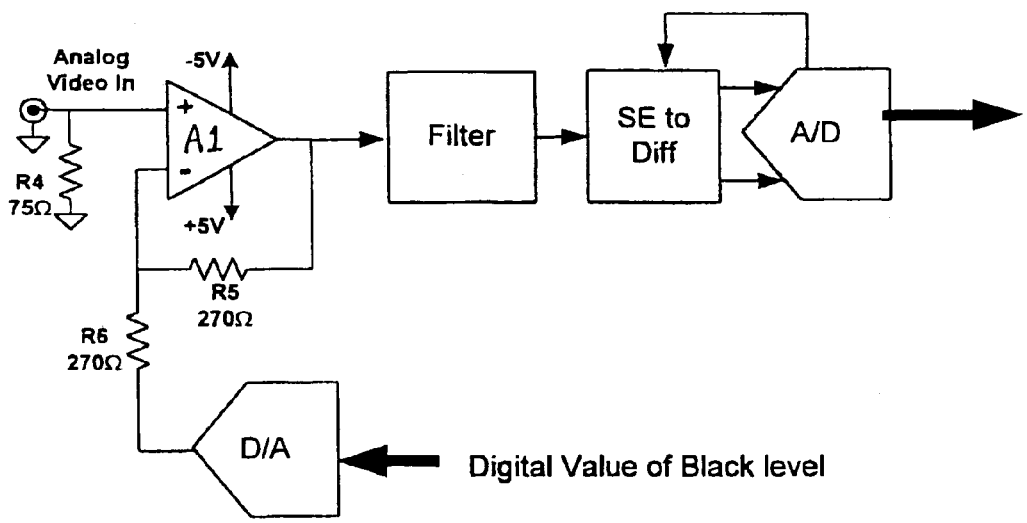
FIG. 2 is a diagram of another prior art circuit for restoring the DC level in a video signal.
Figure 3:
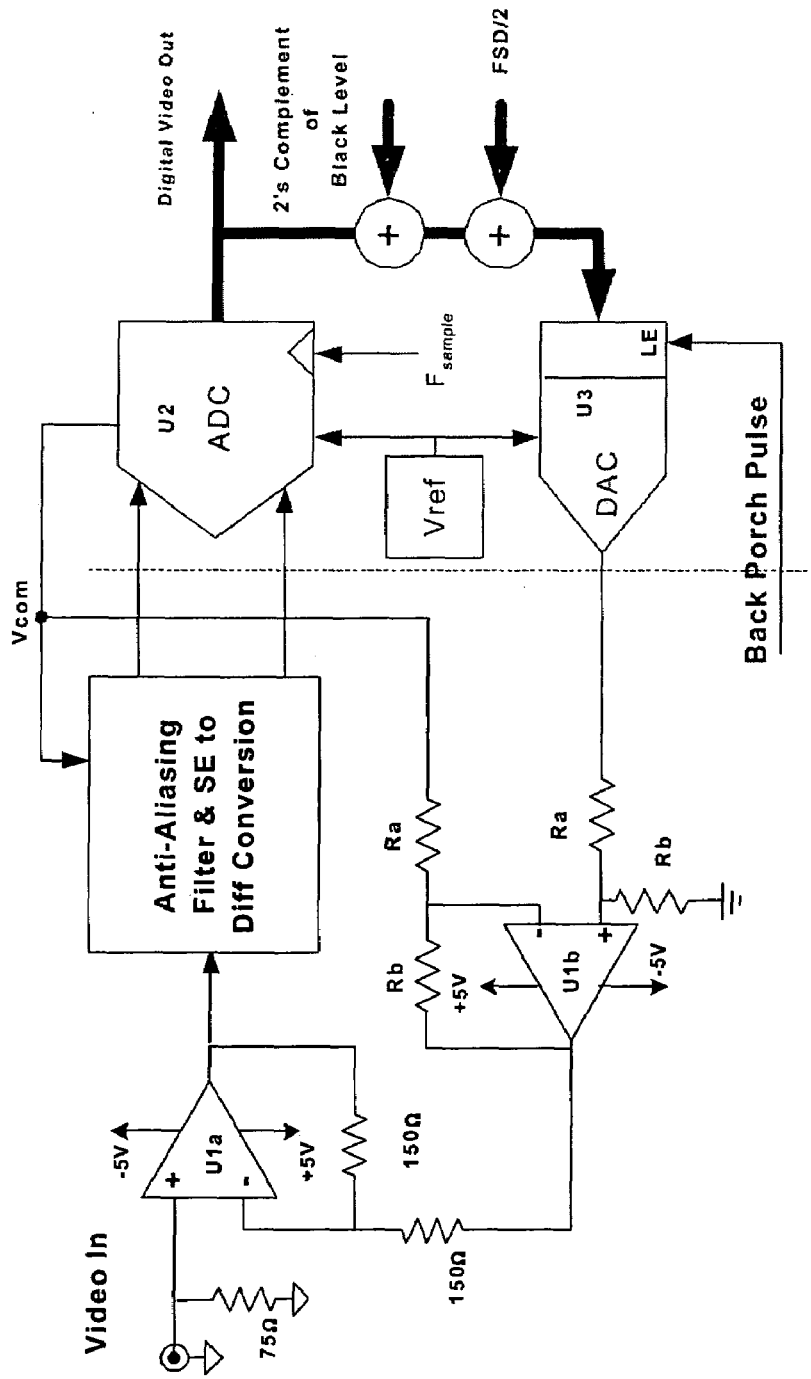
FIG. 3 is diagram illustrating the present invention digital DC restore.

While the present invention is not limited to video signals, the preferred embodiments will be described with respect to such signals for illustrative purposes. Thus, first referring to FIG. 3, a diagram illustrating one embodiment of the present invention may be seen. In this embodiment, the Sync Separator monitors the Video In analog signal to provide the temporal location of the Back Porch Pulse (the Black level immediately following the horizontal sync pulse). The Video In also provides the positive input to the D/C Restore Op-Amp U1a, the output of which is filtered and converted from single ended to differential form (block labeled Ant-Aliasing Filter & SE to Diff Conversion) and then converted to digital form by the analog to digital converter ADC to provide the Digital Video Out. The 2's complement of the Black level is also added to the Digital Video out (which if the Digital Video Out is at the correct Black level, should yield a zero result), as is the digital value of the full scale divided by 2 (DFS/2). The result is applied as the digital input value to the digital to analog converter DAC. The analog output of the DAC provides one input to op-amp U1b, with the other input being the common mode voltage Vcom of the differential signal as set by the biasing of the ADC. In other applications where the reference value (the equivalent of the Black level in the video system) is to be a digital zero value, the 2's compliment addition is not used.

The inputs to the op-amp U1b are by way of resistor networks that provide an output of op-amp U1b (Vout$_{U1b}$) equal to:

$$Vout_{U1b} = \frac{Rb}{Ra}(V_{com} - V_{DAC})$$

where:

$V_{com}$ is the common mode voltage of the differential signal, and $V_{DAC}$ is the output voltage of the DAC The DAC is clocked by the Back Porch Pulse when the Digital Video Out should be at the Black level. If it is not, $V_{DAC}$ will be unequal to $V_{com}$ by an amount equal to the error in the Black level. That error is amplified by op-amp A1b and applied as a bias to op-amp U1a to adjust the level of the single ended output to the op-amp U1a. This changes the differential output of the single ended to differential conversion, with the circuit settling at $V_{DAC}=V_{com}=FSD/2$ within the gain of the loop. At this point, the Digital Video Out plus the 2's complement of the Digital Value of Black equals zero, so the Digital Video Out equals the Digital Value of Black.

The bias provided to the inverting input of op-amp U1a is continuously compared with the Video In waveform, with the difference being converted to the digital domain by a ADC that is clocked at the Temporal Point Fsample, the pixel rate. Thus the DC level of the Video In signal is shifted as necessary to cause the Digital Video Out signal to have the proper Digital Value of Black, as well as all other camera signal values, in spite of offsets in op-amp U1a and the anti-aliasing filter and single ended to differential conversion.

The DAC functions as the S/H and is the dominant pole of the process. In correlated double sampling (CDS) applications, they can be the same. The amplifier U1b then compares the difference, mapped to FSD/2, to the analog Vcom, removing any error due to the difference between them. To the extent there remains any error, the restored level may be altered (corrected) in software in increments of an LSB (least significant bit). That correction may be made in any of various ways, including adjusting the digital value of Black, or in the FSD/2 value. In CDS, the same process as described with respect to the video signal at the horizontal sync rate proceeds at the pixel rate.

The present invention accomplishes several things:

1. It restores the waveform's DC level to quantized reference, not a weakly correlated analog voltage, reducing error.

2. It reduces the offset error of U1a by the loop gain.

3. It removes any error in Vcom compared to FSD/2, as well as the offset errors of the op-amp U1a, the filter, and the SE to Diff Converter.

The present invention may be realized in integrated circuit or discrete form, or a combination of the two as desired. Also, microprocessor embodiment, particularly for execution of the digital data manipulations under program control, may also be used if desired.

While certain preferred embodiments of the present invention have been disclosed herein, such disclosure is only for purposes of understanding the exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A method of restoring the DC level of a first analog signal having a waveform to be digitized comprising:

continuously converting a second analog signal to a first digital signal using an analog to digital converter having a zero value output when an input to the analog to digital converter is an analog signal corresponding to one half full scale digital output of the analog to digital converter;

adding one half of the full scale digital output to the first digital signal and applying the result to a digital to analog converter;

clocking the digital to analog converter each time the DC value of the waveform is to be restored;

continuously amplifying the difference between the output of the digital to analog converter and the analog signal corresponding to one half full scale digital output of the analog to digital converter to provide a third analog signal; and, continuously amplifying the difference between the first analog signal and third analog signal to provide the second analog signal.

2. The method of claim 1 wherein the input to the analog to digital converter is a differential input, and the voltage that would provide a digital zero output of the analog to digital converter is a common mode voltage of a zero differential input to the analog to digital converter.

3. The method of claim 1 wherein a 2's compliment digital value corresponding to the DC level to be restored is also added to the input to the digital to analog converter.

4. The method of claim 1 wherein the method is practiced using an integrated circuit.

5. The method of claim 4 wherein the digital data manipulation is done under program control.

6. A method of restoring the black level of an analog video signal to be converted to a digital video signal comprising:

converting a first analog signal to the digital video signal in an analog to digital converter having a zero value output when an input to the analog to digital converter is an analog signal corresponding to one half full scale digital output of the analog to digital converter;

adding one half of the digital full scale value and the 2's compliment digital value of the black level to the first digital signal and applying the result to a digital to analog converter;

clocking the digital to analog converter during the back porch of horizontal sync signals;

continuously amplifying the difference between the output of the digital to analog converter and the voltage that would provide a digital zero output of the analog to digital converter to provide a second analog signal; and, continuously amplifying the difference between the analog video signal and the second analog signal to provide the first analog signal.

7. The method of claim 6 wherein the input to the analog to digital converter is a differential input, and the voltage that would provide a digital zero output of the analog to digital converter is a common mode voltage of a zero differential input to the analog to digital converter.

8. The method of claim 6 wherein the method is practiced using an integrated circuit.

9. The method of claim 8 wherein the digital data manipulation is done under program control.

10. A method of restoring the black level of an analog video signal to be converted to a digital video signal comprising:
- providing an analog to digital converter having a differential input with a common mode voltage corresponding to one half full scale digital output of the analog to digital converter;
- converting a first analog signal to the digital video signal by the analog to digital converter;
- adding one half of the digital full scale value and the 2's compliment digital value of the black level to the digital video signal and applying the result to a digital to analog converter;
- clocking the digital to analog converter during the back porch of horizontal sync signals;
- continuously amplifying the difference between an output of the digital to analog converter and the common mode voltage of the analog to digital converter differential input to provide a second analog signal; and,
- continuously amplifying the difference between the analog video signal and the second analog signal to provide the first analog signal.

11. The method of claim 10 wherein the method is practiced using an integrated circuit.

12. The method of claim 11 wherein the digital data manipulation is done under program control.

* * * * *